Feb. 6, 1968 R. W. SPAUDE 3,368,116

THIN FILM CIRCUITRY WITH IMPROVED CAPACITOR STRUCTURE

Filed Jan. 18, 1966

INVENTOR.
ROBERT W. SPAUDE

BY Thomas C. Schatzel

United States Patent Office 3,368,116

Patented Feb. 6, 1968

3,368,116
THIN FILM CIRCUITRY WITH IMPROVED CAPACITOR STRUCTURE

Robert W. Spaude, Milwaukee, Wis., assignor to Allen-Bradley Company, Milwaukee, Wis., a corporation of Wisconsin Filed Jan. 18, 1966, Ser. No. 521,365
4 Claims. (Cl. 317—101)

ABSTRACT OF THE DISCLOSURE

A thin film electrical circuit including a capacitive component comprising superimposed film layers deposited upon a non-conductive supporting substrate, the first layer being of an electrically conductive material to serve as a common electrode, the second film layer being of a non-conducting dielectric material, and the third film layer comprising a pair of spaced apart, electrically conducting electrode areas, each being in capacitive relationship with the common electrode defined by the first film layer. Terminal means are respectively connected to each of the spaced apart electrode areas.

The present invention relates to thin film electrical circuitry and more specifically to thin film circuitry including a capacitive element with two spaced electrode areas on one surface of a thin film dielectric medium and a common electrode on the opposing surface in capacitive relationship with each of the two spaced electrode areas, thereby simulating two capacitive segments in series to form a single capacitive component with the terminals to the capacitive component joining electrode segments positioned on a common side of the dielectric.

The present invention permits inclusion of capacitive components in passive and hybrid thin film circuits with all interconnections between the various components and leads to external circuits being made on one surface with respect to the dielectric medium. These circuits may be capacitance only, resistance-capacitance, capacitance with active or passive elements added, or resistance-capacitance with active or passive elements added. The invention further permits use of thin film deposition techniques, e.g. such as evaporation, high frequency sputtering, low energy sputtering and high energy sputtering, in creating the various components, eliminating the need for mechanical masks which are conventionally used for establishing circuit patterns. Consequently, many of the problems encountered in using mechanical masks are avoided. Circuit pattern registration and line-up difficulties are alleviated. Variations in the sharpness of the evaporated film at the mask edges due to under-the-edge contamination, frequently resulting in poor adhesion of the next evaporated film layer, are alleviated.

In the present invention, an electrically non-conductive solid substrate of high chemical and electrical stability is selected. A first conductive film is deposited over the substrate. Next, a dielectric film medium is deposited over the first conductive film. The thickness of the dielectric film is at least sufficient to completely cover the electrically-conductive film. Next, a second electrically-conductive film is deposited over the top surface of the dielectric medium. The top film pattern is then established to produce the desired circuit pattern image. The top film may be designed to create a capacitive element by having two separated electrode areas in capacitive relationship with the electrode film on the bottom surface of the dielectric. The capacitive component is a two lead component with a lead attached to each of the two top electrodes to interconnect other electrical devices deposited on the top surface or terminal pads which may be joined to external devices or circuitry.

The electrode on the bottom surface is common to both top electrodes thus forming two capacitive segments in series. Thin film resistive elements may be formed from the top evaporated layer to form a resistive-capacitive network. Active elements can be further added in the form of "chips" soft soldered or welded to the top film. Thus, the top working area is planar—without steps. The film layer consists of the complete thin film circuit layout, permitting resistor and capacitor adjustments and also the attachment of active elements. There are no leads extending between layers as is usual for interconnecting capacitive components.

The present design also provides a capacitor which can withstand higher voltages. This results from the fact that opposing electrodes, across which the voltage difference exists, are on the same plane, and the voltage is divided across two layers of the dielectric. Also, the electric field edge effect problems encountered with the "step method" of capacitor design is eliminated.

The foregoing features and advantages of the invention will appear in the description to follow. Reference is made in the description to the accompanying drawings which form a part thereof and in which there is shown by way of illustration and not of limitation one specific form in which the invention may be embodied.

Figure 1:
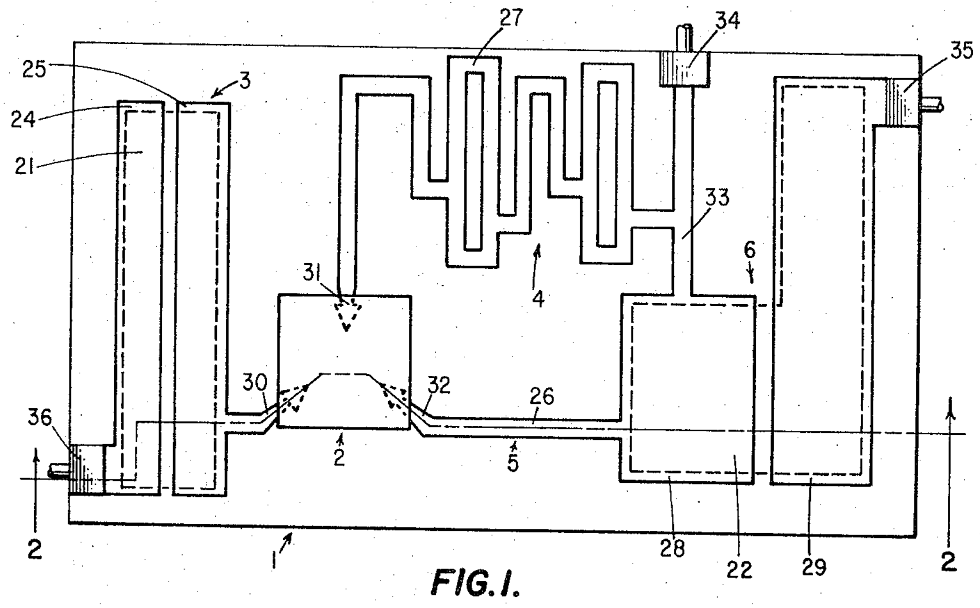
FIG. 1 is an enlarged plan view of a hybrid thin film circuit network incorporating the principles of this invention and including capacitive, resistive and transistor components.
Figure 2:
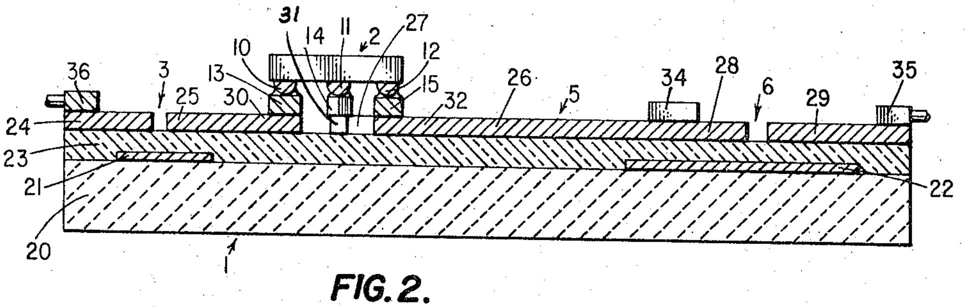
FIG. 2 is a transverse sectional view of the circuit network of FIG. 1 taken along the line 2—2. The thickness of the various films are exaggerated to more clearly illustrate the invention.
Figure 3:
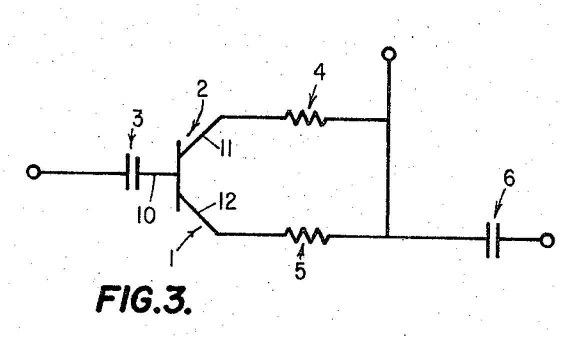
FIG. 3 is a diagrammatic circuit network of FIG. 1.

Referring more specifically to FIGS. 1–3, the illustrated embodiment is a hybrid thin film circuit referred to by the general reference character 1. In FIG. 3, the circuit 1 is shown as including an active component in the form of a PNP transistor referred to by the general reference character 2; a first capacitive component referred to by the general reference character 3; a pair of resistive components referred to by the general reference characters 4 and 5; and a second capacitive component referred to by the general reference character 6.

The transistor 2 is in the form of a conventional "chip" with a base lead 10, a collector lead 11 and an emitter lead 12. As illustrated in FIG. 2, the base lead 10 is attached to a conducting pad 13, the collector lead 11 to a conducting pad 14 and the emitter lead 12 to a conducting pad 15.

The circuit 1 includes a non-conductive, solid substrate 20. The substrate 20 provides mechanical strength and a medium on which the various thin film layers may be superimposed. On the top surface of the substrate 20 is a pair of electrically-conductive films 21 and 22. The film 21 serves as a common electrode to the capacitive component 3 and the film 22 serves as a common electrode to the capacitive component 6. Deposited on the thin films 21 and 22 and the exposed surface of the substrate 20 is a thin film 23 of a dielectric medium. The film 23 is distributed across the entire exposed surface of the substrate 20 and the films 21 and 22. Another film of metallic, electrically-conductive material is deposited on the opposite surface of the dielectric film 23. The film of conductive material is etched to form a pair of thin film electrode areas 24 and 25 each of which is in capacitive relationship with the common electrode film 21. The electrodes 21, 24 and 25 form a capacitive component with the two areas interconnected in series by the common electrode 21. It may be noted that since both electrode areas 24 and 25 are on a similar plane, connections joining other electrical elements with the electrode areas may be in a common plane.

Also, as illustrated, the pattern of the top film may be such to form a thin film path pattern 26. The pattern 26 may be selected so as to form the resistive component 5 with the net resistance being dependent upon the selected material, the length and cross-sectional dimensions of the pattern.

The other resistive component 4 is comprised of a thin film path pattern 27. As illustrated, the pattern of the path 27 is substantially different than that of the path 26 and consequently, the net resistive value differs.

In the illustrated embodiment, another pair of thin film electrode areas 28 and 29 are formed on the top surface of the dielectric 23 to establish the capacitor 6. The two electrode areas 28 and 29 utilize the common electrode 22 to simulate a pair of capacitive segments in series. Means for interconnecting other elements to the capacitor 6 are joined to the electrodes 28 and 29.

In the circuit 1, the pad 13, electrically common to the base 10, is joined to the electrode area 25 of the capacitor 3 by a terminal means comprising a thin film lead segment 30 which may be an extension of the electrode 25. The pad 14, electrically common to the collector 11, is joined to the film path 27 of the resistor 4 by a terminal means comprising a thin film lead segment 31 which may be an extension of the path 27. The pad 15, electrically common to the emitter 12, is joined to the film path 26 of the resistor 5 by a terminal means comprising a thin film lead segment 32 which may be an extension of the path 26. The film path 26 extends to and interconnects with the electrode area 28 of the capacitor 6 with the junction therebetween forming a terminal means between the two elements. The electrode 28 has a further thin film lead 33 connecting with the other end of the film 27 of the resistor 4. The lead 33 terminates at a terminal pad 34. The electrode 29 of the capacitor 6 connects with a terminal means in the form of a terminal pad 35. The input to the circuit 1 is received at a terminal pad 36 which is a common terminal means to the electrode 24 of the capacitor 3.

Incorporating the principles of utilizing a common electrode on one surface in capacitive relationship with two electrode areas on an opposing surface to form a capacitive component permits a capacitive circuit network to be realized with all terminals being placed on a common planar surface. As such, the number of interconnections are minimized. There are no circuit connections between the various thin film layers. The problems common with variations in thickness and interruptions in the thin film pattern around planar edges is alleviated. Furthermore, mechanical masks, which are commonly used in evaporation techniques, are not necessary when laying down the various layers of dielectric and electrodes. The layers may be evaporated over the complete area and then the desired pattern formed. For example, in the illustrated embodiment, the top surface of the substrate may be completely coated with an electrode material and then etched to form the electrodes 21 and 22. Next, the dielectric 23 may be deposited over the entire exposed area and immediately following this deposition, the entire top surface of the dielectric may be coated with a continuous metallic, electrically-conductive film material. The image detail of the electrode areas 24, 25, 28, 29; resistors 4 and 5; leads 30, 31, 32 and 33 may all be etched in one step to produce the desired pattern. This tends towards high production capacity. A plurality of circuits may be formed at one time and then sub-divided into individual circuits. Also, the fact that the top working area is planar—without stepped layers, permits the film layer to consist of the complete circuit layout to allow for resistor and capacitor adjustments.

To realize the structure heretofore described, one may use any of various means for depositing the various layers, e.g. evaporation, sputtering, etc. First, a substrate is selected. Substrates frequently used are a solid insulating material in the form of a glass or ceramic. Also, a conductive material having an insulative coating deposited thereon may be employed. A substrate having a smooth surface high chemical stability and high electrical stability is preferred. The substrate is carefully cleaned to support and adhere to a deposited, conductive film. The deposited films are generally very thin and the smoother the substrate surface, the more assurance there is that the desired surface is coated with uniform thickness. Next, a metallic electrically-conductive film of electrode material is coated over the substrate. This coat may be over the entire top surface of the substrate. Then the film of electrode material may be formed, e.g. by photo-masking or electro-etching to the desired electrode configuration. If distributed capacitance to all of the top layer of pattern circuitry is desired, the first electrically-conductive layer need not be interrupted. Next, the dielectric medium, e.g. the dielectric 23, is deposited.

The dielectric medium may be any one of the various materials which can be deposited by known techniques. For example, silicon oxides, titanium oxides and tantalum oxides have proved highly satisfactory where deposition techniques are used. If silicon oxides are used, silicon monoxide can be placed in a graphite crucible and evaporated by induction heating methods. The silicon oxide has good adherence to clean glass and most metallic films like chromium, chromium-nickel alloy and chromium-cobalt alloy. The dielectric may be deposited over the entire surface. It may be noted that the dielectric need not be interrupted since there are no connections to the electrode covered by the dielectric. This alleviates a problem commonly encountered with devices heretofore available. Frequently, the substrate and dielectric are susceptible to being etched by the same material requiring the use of mechanical masks.

After deposition of the dielectric medium, another layer of metallic, electrically-conductive material is deposited on the top surface of the dielectric medium. This layer of electrode material may then be formed to establish the other electrode areas, e.g. 24, 25, 28 and 29, of the capacitive components 3 and 6 and the other components, e.g. the resistors 4 and 5. The electrode layers on the opposing surfaces of the dielectric may comprise the same material. Chromium-cobalt alloys, chromium-nickel alloys, gold, silver, aluminum, copper, chromium, have proven satisfactory in forming films. Evaporated films of chromium, chromium-nickel alloy and chromium-cobalt alloy have been very satisfactory as they have smooth surfaces which aid in realizing a good yield of capacitors. Also, layers of chromium and chromium-based alloys have good adherence to glass substrates. The techniques used to produce the electrodes and resistive components may be similar to those used for producing precision metal grid resistors. For an example, see United States Patent No. 2,953,484 granted to B. F. Tellkamp on Sept. 20, 1960, and assigned to the assignee of the present invention.

When active elements are to be included, e.g. as shown in the embodiment of FIGS. 1–3, the active chips may be attached by soldering or welding them to an evaporated film of copper, heretofore referred to as pads. The pads may be realized by an additional deposition. This deposition may comprise a chromium-copper evaporated film. The chromium is evaporated first and then phased out while copper evaporation is phased in. Then copper is evaporated to build up the copper pads for soft soldering on the chips of active elements, e.g. transistors or diodes. A negative photo-emulsion mask can be used during the chromium-copper evaporation run to allow removal of the film from those areas where pads are not desired; or a positive photo mask after deposition can permit chemical removal of film from areas where pads are not desired.

Heretofore, the discussion has pertained to the situation wherein the electrodes and other components on the top layer comprise the same material. Obviously, by additional deposition and pattern-forming steps, the elements may comprise differing materials.

I claim:

1. In a thin film electrical circuit, a capacitive component comprising an electrically non-conductive solid substrate;

a first electrically conductive film adherently deposited on said non-conductive solid substrate to serve as a common capacitive electrode;

a film of dielectric material adherently deposited on the electrically conductive fim opposite said non-conductive solid substrate;

a second electrically conductive film adherently deposited on the film of dielectric material opposite the first electrically conductive film, the second electrically conductive film comprising a pair of spaced apart electrode areas, each area in capacitive relationship with the common electrode defined by said first electrically conductive film; and terminal means respectively connected to each of said spaced apart electrode areas.

2. The thin film electrical circuit of claim 1 in which the second electrically conductive film comprises a pair of spaced apart electrode areas and a resistive component, said electrode areas each being in capacitive relationship with the common electrode defined by said first electrically conductive film, said resistive component and the terminal means of one of said electrical areas being interconnected to form a resistive-capacitive circuit.

3. The thin film electrical circuit of claim 1 in which the second electrically conductive film comprises a pair of spaced apart electrode areas and electrical lead segments, said electrode areas each being in capacitive relationship with the common electrode defined by said first electrically conductive film, and said lead segments adapted to receive an active electrical component.

4. The thin film electrical circuit of claim 1 in which the second electrically conductive film comprises a pair of spaced apart electrode areas, a resistive component and electrical lead segments, said electrode areas each being in capacitive relationship with the common electrode defined by said first electrically conductive film and said lead segments being adapted to receive an active electrical component, the second electrically conductive film also comprising interconnections joining said electrodes, resistive component and lead segments.

References Cited

UNITED STATES PATENTS

| | | | |
|---|---|---|---|
| 2,389,420 | 11/1945 | Deyrup | 317—261 |
| 2,398,176 | 4/1946 | Deyrup | 317—261 |
| 3,138,744 | 6/1964 | Kilby | 317—101 |
| 3,256,588 | 6/1966 | Sikina et al. | |

ROBERT K. SCHAEFER, *Primary Examiner.*

J. R. SCOTT, *Assistant Examiner.*